United States Patent
Lin

(10) Patent No.: US 6,806,190 B2
(45) Date of Patent: Oct. 19, 2004

(54) STRUCTURE OF SEMICONDUCTOR ELECTRONIC DEVICE AND METHOD OF MANUFACTURING THE SAME

(75) Inventor: Liu Guo Lin, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 408 days.

(21) Appl. No.: 10/023,759

(22) Filed: Dec. 21, 2001

(65) Prior Publication Data

US 2003/0155620 A1 Aug. 21, 2003

Related U.S. Application Data

(62) Division of application No. 09/663,692, filed on Sep. 19, 2000, now abandoned.

(30) Foreign Application Priority Data

Feb. 22, 2000 (JP) .................................... 2000-044246

(51) Int. Cl.[7] .............................................. H01L 21/44
(52) U.S. Cl. ...................... 438/682; 438/595; 438/630; 438/655; 438/664
(58) Field of Search ................................ 438/265, 595, 438/630, 655, 664, 682, 755

(56) References Cited

U.S. PATENT DOCUMENTS

| | | | | |
|---|---|---|---|---|
| 4,897,703 A | * | 1/1990 | Spratt et al. ................. | 257/586 |
| 5,397,722 A | * | 3/1995 | Bashir et al. ................ | 438/303 |
| 5,491,099 A | * | 2/1996 | Hsu | |
| 6,018,179 A | * | 1/2000 | Gardner et al. ............. | 257/336 |
| 6,180,477 B1 | * | 1/2001 | Liao .......................... | 438/305 |
| 6,461,951 B1 | * | 10/2002 | Besser et al. ................ | 438/592 |
| 6,548,403 B1 | * | 4/2003 | Ngo et al. ................... | 438/682 |

* cited by examiner

Primary Examiner—Douglas Wille
(74) Attorney, Agent, or Firm—Venable LLP; Michael A. Sartori; Daniel G. Vivarelli, Jr.

(57) ABSTRACT

In order to prevent silicides from getting under side walls when the silicides are formed over MOSFET formed over an SOI substrate, trenches are defined in the SOI substrate and side walls are formed over the trenches, whereby the silicides are blocked so as not to get under a gate insulator with a lower portion of each side wall as a structure convex in a downward direction of the substrate. Thus, an increase in gate withstand voltage, a decrease in gate leakage current and control on a short channel effect are achieved.

13 Claims, 7 Drawing Sheets

STRUCTURE OF SEMICONDUCTOR ELECTRONIC DEVICE AND METHOD OF MANUFACTURING THE SAME

This application is a Division of Ser. No. 09/663,692 filed on Sep. 19, 2000 now abandoned.

BACKGROUND OF THE INVENTION

1. Field of the Invention

The present invention relates to a semiconductor electronic device typified by MOSFET or the like, and particularly to a structure suitable for use in a semiconductor electronic device using an SOI substrate and a method of manufacturing it.

2. Description of the Related Art

According to a reference: "SIMOX-LSI Technology Latest Report" by High-Technology Promotion Institute Corp., p 220, issued in 1998 (in the tenth year of Heisei), attention has been focused on an electronic device formed over an SOI (Silicon On Insulator) substrate as a device having excellent characteristics such as low power consumption, speeding-up, etc. Various element technologies about the design, production, etc. of the electronic device have been studied together with a wafer manufacturing technology. As shown in the reference, a process for forming silicides has been widely used to reduce sheet resistances of source and drain regions and a gate electrode region of a transistor.

However, the silicides have features that they are selectively formed by reaction with a metal and Si alone and they will not be formed without reaction with the metal and $SiO_2$. Since a micro device is short in gate length, silicides are grown so as to seat below or get under side walls formed over side walls of a gate electrode upon formation of the silicides in its source and drain regions, and they reach near a gate oxide film. Thus, this will create problems such as an increase in gate leakage current, a reduction in gate withstand voltage, a short channel effect, etc.

SUMMARY OF THE INVENTION

In order to solve the above-described problems, an object of the present invention is to provide a structure suitable for use in a semiconductor electronic device, wherein each of side walls provided over sides of a gate electrode of a field effect transistor formed over a substrate has a structure convex toward the substrate side, and silicides are formed over a source and drain of the field effect transistor and a gate electrode thereof and not grown to the portion under the side walls of the gate electrode.

Further, the present invention provides a structure suitable for use in a semiconductor electronic device, wherein side walls composed of silicides, which are lower than side walls formed on the sides of a gate electrode of a field effect transistor formed over a substrate, are formed in contact with the side walls formed on the sides thereof, and silicides are respectively formed over a source, a drain and the gate electrode of the field effect transistor and not grown to the portion under the side walls of the gate electrode.

Furthermore, the present invention provides a method of manufacturing a semiconductor electronic device, which is capable of easily forming the above structure in a simple process.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFFERED EMBODIMENTS

The present invention aims to control the transverse growth of silicides downward of a gate, reduce a gate leakage current, enhance a gate withstand voltage and improve a short channel effect. Further, the present invention is suitable for use in a device using an SOI substrate. However, the present invention can be applied even to a device using a conventional Si substrate and is effective therefor.

Respective embodiments will hereinafter be described in detail with reference to the accompanying drawings.

First Embodiment

Figure 1:
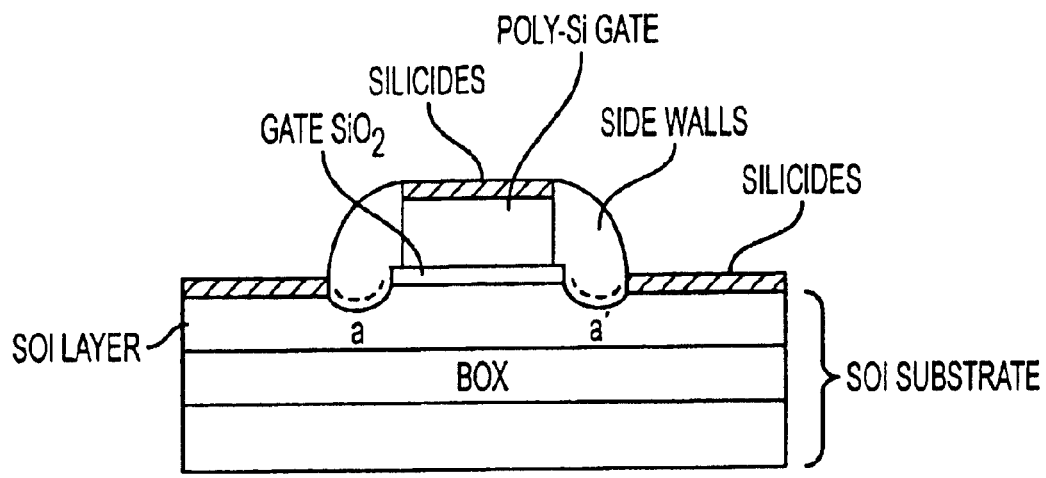
FIG. 1 is a structure cross-sectional view (1) for describing a first embodiment of the present invention.
Figure 2:
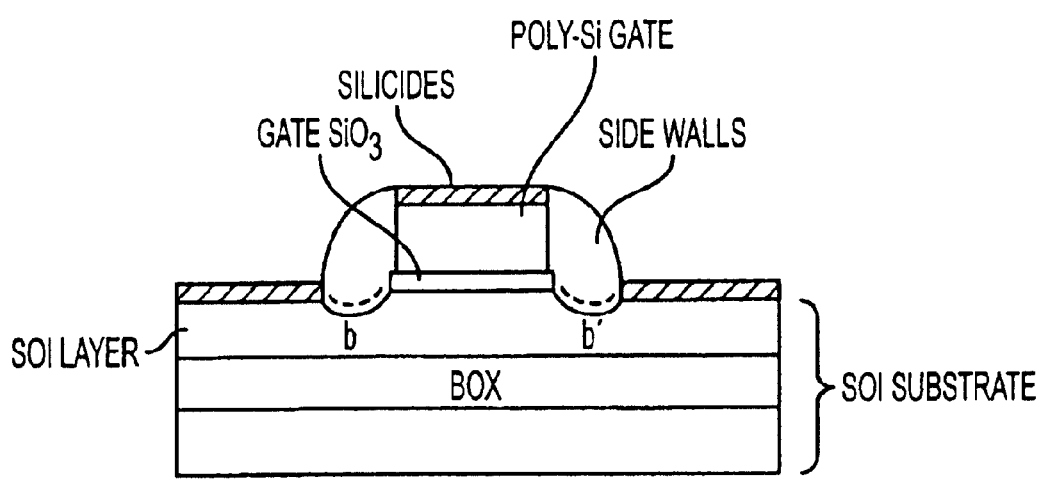
FIG. 2 is a structure cross-sectional view (2) for describing the first embodiment of the present invention.

FIGS. 1 and 2 are respectively structure cross-sectional views for describing a first embodiment of the present invention. In a structure suitable for use in a semiconductor electronic device using an SOI substrate, structures convex toward the SOI substrate side are provided below side walls on the sides of a gate electrode after the formation of the gate electrode as designated at symbols a and a' in FIG. 1. The shape of each structure may be accurate. Alternatively, their shapes may be rectangular as designated at symbols b and b' in FIG. 2.

Owing to the provision of the oxide film structures convex toward the SOI substrate sides below the side walls as designated at symbols a and a' in FIG. 1 and symbols b and b' in FIG. 2, the growth of silicides is blocked and thereby stops by oxide films convex toward the substrate side when the silicides are formed over the source, drain and gate of a transistor. Therefore, the silicides do not seat or get under the side walls.

In the structures according to the present invention as shown in FIGS. 1 and 2, no silicides dives under the side walls. The resultant device can achieve a reduction in gate leakage current, an increase in gate withstand voltage and an improvement in short channel effect.

Second Embodiment

Figure 3:
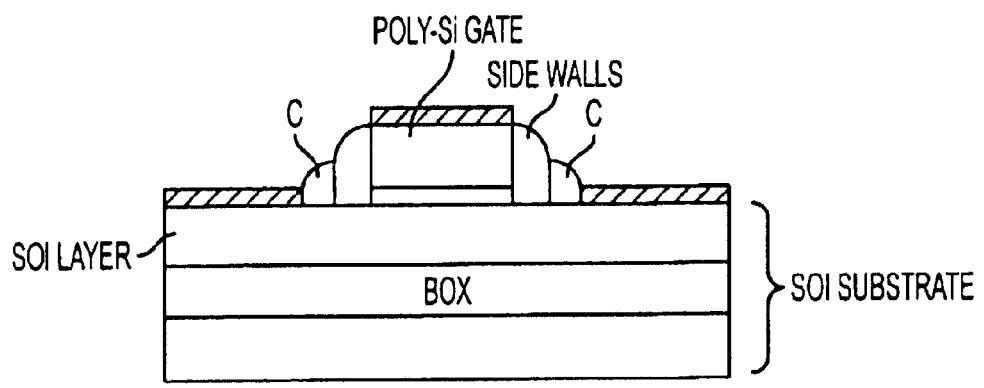
FIG. 3 is a structure cross-sectional view for describing a second embodiment of the present invention.
Figure 4A:
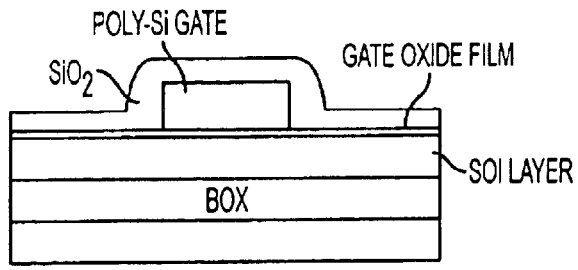
FIG. 4 is a process cross-sectional view for describing a third embodiment of the present invention.
Figure 4B:
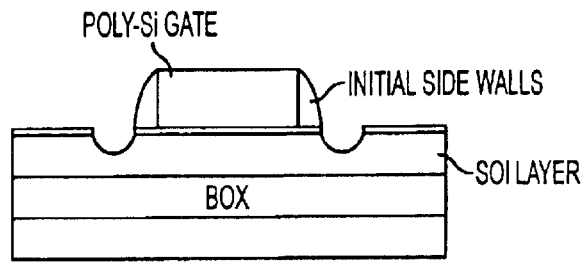
Figure 4C:
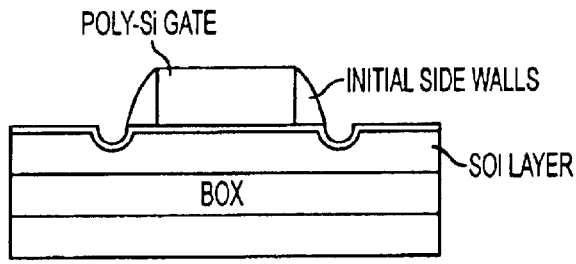
Figure 4D:
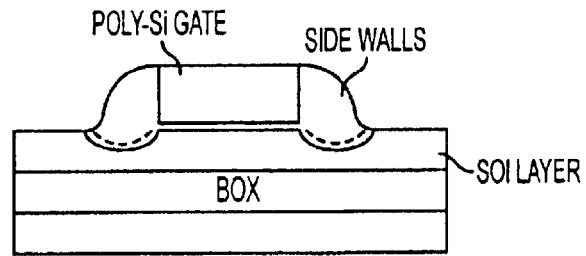
Figure 4E:
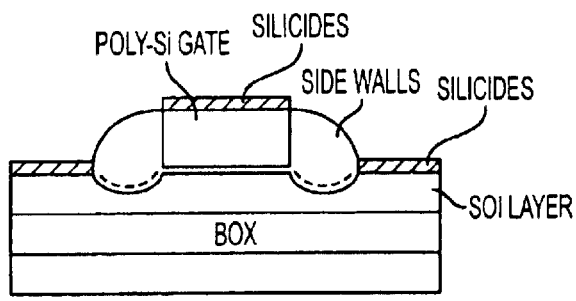
Figure 5A:
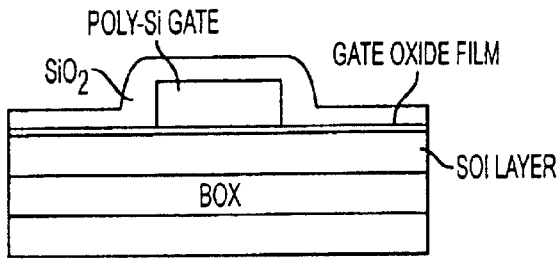
FIG. 5 is a process cross-sectional view for describing a fourth embodiment of the present invention.
Figure 5B:
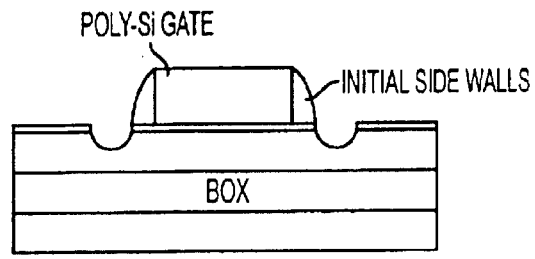
Figure 5C:
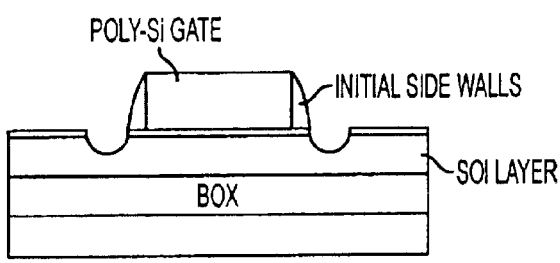
Figure 5D:
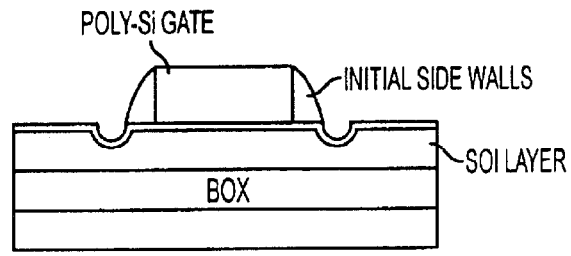
Figure 5E:
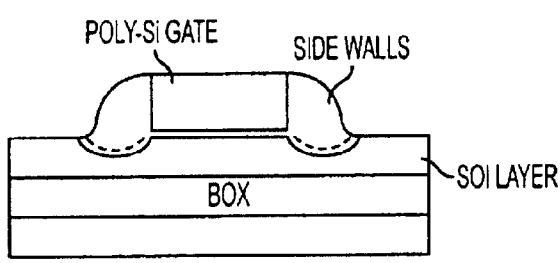
Figure 5F:
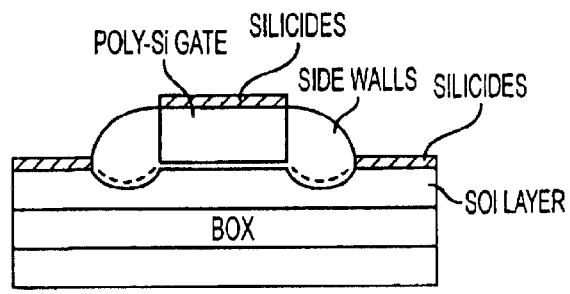
Figure 6A:
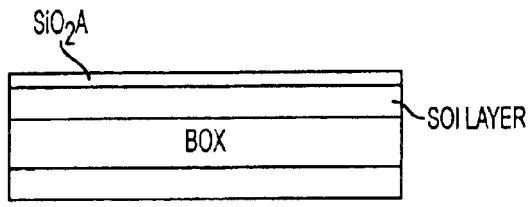
FIG. 6 a process cross-sectional view for describing a fifth embodiment of the present invention.
Figure 6B:
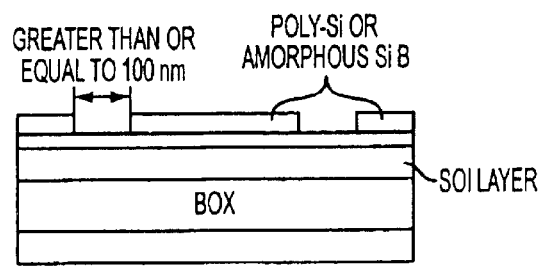
Figure 6C:
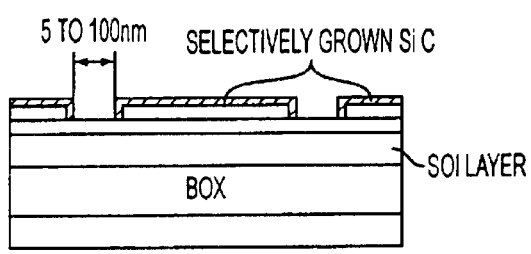
Figure 6D:
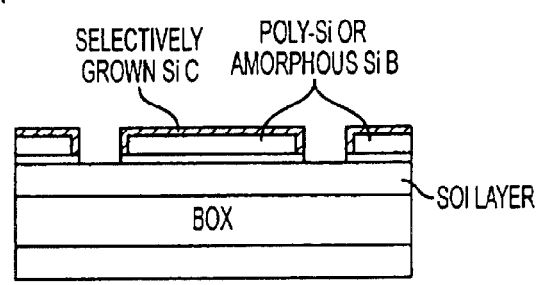
Figure 6E:
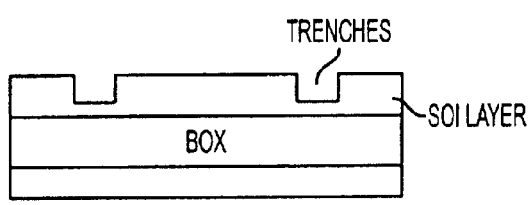
Figure 6F:
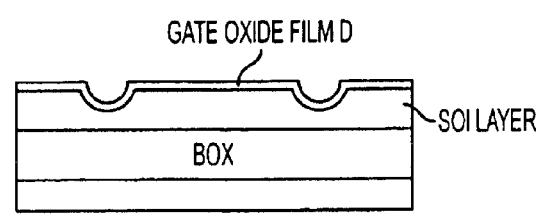
Figure 6G:
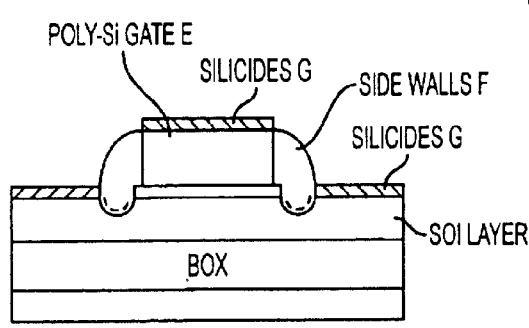
Figure 7A:
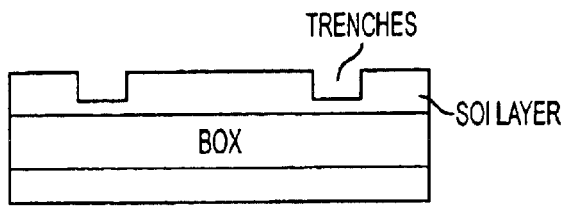
FIG. 7 is a process cross-sectional view for describing a sixth embodiment of the present invention.
Figure 7B:
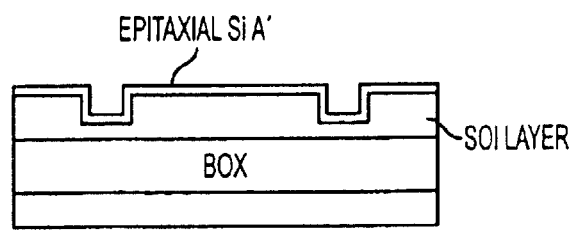
Figure 7C:
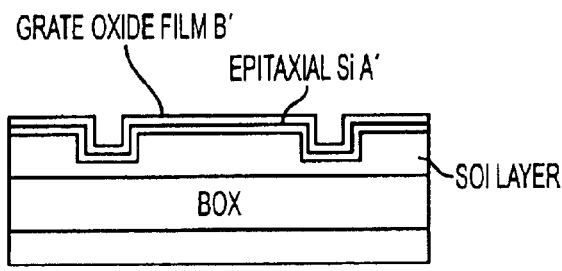
Figure 7D:
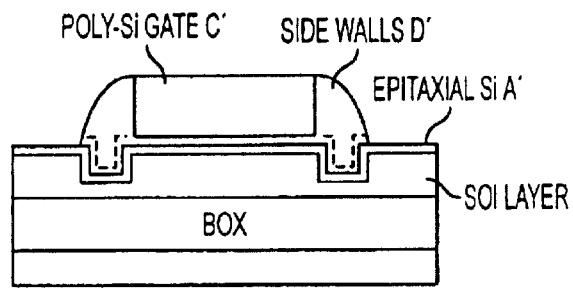
Figure 7E:
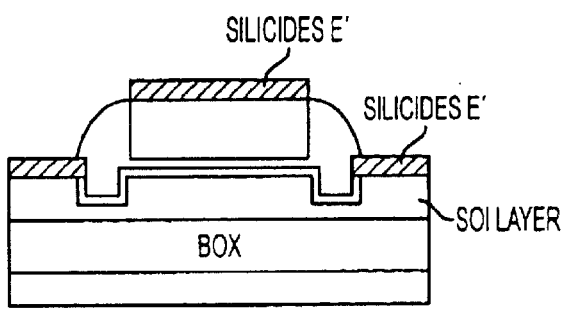

FIG. 3 is a structure cross-sectional view for describing a second embodiment of the present invention. A semiconductor electronic device using an SOI substrate takes a structure wherein as shown in FIG. 3, a gate electrode is formed and thereafter side walls (see c and c' in FIG. 3) composed of silicides are formed outside portions below side walls each comprised of an insulating material, which are formed on the sides of the gate electrode. This structure has a structure wherein side walls each composed of Poly-Si or amorphous Si, i.e., side walls (sub side walls) smaller than the side walls composed of the insulating material in both height and width are first formed outside portions below the side walls each composed of the insulating material, the sub side walls and a metal are allowed to reach with each other so as to be brought into silicidation, and the silicided ones are formed integrally with silicides used for a source and a drain.

When the Poly-Si or amorphous Si is placed in such locations as designated at c and c' in FIG. 3 to thereby form silicides over the source, drain and gate of a transistor, the Poly-Si or amorphous Si placed in such locations as designated at c and c' in FIG. 3 also reacts with a metal simultaneously so as to be brought into silicidation. At this time, the metal, which reacts with Si of the SOI substrate, is etched at the portions designated at c and c', and hence the silicided ones do not grow up to below a gate oxide film. Thus, the silicides do not get under the side walls.

In such a structure as shown in FIG. 3, according to the present invention, no silicides get under the side walls. The resultant device can achieve not only an improvement in gate withstand voltage but also a reduction in gate leakage current. While FIG. 3 shows the case using the SOI structure, the present invention can be of course applied to the conventional Si substrate.

Third Embodiment

FIG. 4 is a process cross-sectional view for describing a third embodiment of the present invention. As shown in FIG. 4(1), an oxide film ($SiO_2$) for forming first side walls is formed by a CVD method or the like after the formation of a gate electrode. As shown in FIG. 4(2), side wall etching is effected on the oxide film by dry etching using $CF_4$ gas or the like. In the present invention, however, etching is excessively effected without increasing a selection ratio at etching, and a trenching effect at each edge is utilized to etch even Si of an SOI layer at the edge. As shown in FIG. 4(3), thermal oxidation is then effected under the same condition as gate oxidation. Thereafter, an oxide film identical in quality to a gate oxide film is formed over the exposed Si portions. Next, side wall formation is executed again as shown in FIG. 4(4) by the CVD method or the like, so that side walls each having a shape convex downwardly toward the SOI layer are formed under the previous side walls. Thereafter, the surface of the SOI layer and the surface of the gate electrode are allowed to react with a metal so as to be brought into silicidation.

When the silicides are formed over the source, drain and gate electrode through the use of the side wall structure formed by the above-described method, the silicidation at the source and drain is blocked by the oxide film convex downwardly toward the SOI substrate, thus causing no transverse growth of the silicides downward of the gate oxide film.

According to the manufacturing method of the present invention such as shown in FIGS. 4(1) through 4(5), the silicides do not get under the side walls. Further, the resultant device allows not only an improvement in gate withstand voltage but also a reduction in gate leakage current. While the present embodiment shows the case using the SOI substrate, it is needless to say that it can be also applied to the conventional Si substrate.

Fourth Embodiment

FIG. 5 is a process cross-sectional view for describing a fourth embodiment of the present invention. As shown in FIG. 5(1), a gate electrode is formed and thereafter an oxide film ($SiO_2$) used for first side walls is deposited thereon by a CVD method or the like. Further, as shown in FIG. 5(2), first side wall etching is effected with dry etching using $CF_4$ gas or the like, and a trenching effect at each edge is utilized to etch even Si of an SOI layer at the edge. As shown in FIG. 5(3), the exposed Si is further etched by using an Si etching solution such as an ammonia solution of 1–30% or a hydrofluoric acid+hydrogen peroxide solution or the like. Next, as shown in FIG. 5(4), the exposed Si (etched portions) are oxidized to form oxide films identical in quality to a gate oxide film. Next, side walls are formed again as shown in FIG. 5(5). Consequently, portions below the side walls respectively have shapes convex downwardly toward the SOI layer.

When the side wall structure formed by the above-described method is utilized to allow Si to react with a metal for the purpose of forming silicides, the silicides are blocked by the oxide films convex downwardly toward the SOI layer and hence no transverse growth of silicides downward of the gate oxide film occurs. Further, the degree of convexity of the oxide film toward the SOI substrate side can be adjusted by etching before the side walls are formed again by the CVD method or the like. Thus, the present embodiment also has the advantage that the degree of downward convexity of the oxide film can be controlled according to the thickness of each silicide layer.

In the structure of the present invention such as shown in FIG. 5(6), the degree of convexity of the oxide film below each side wall toward the substrate side can be controlled according to the thickness of the silicides upon formation of the silicides different in thickness from each other. Thus, the silicides do not get under the side walls upon formation of the silicide films different in thickness from each other. The resultant device allows not only an increase in gate withstand voltage but also a decrease in gate leakage current.

Fifth Embodiment

FIG. 6 is a process cross-sectional view for describing a fifth embodiment of the present invention. $SiO_2$ A having a thickness of from 5 nm to 50 nm, which is shown in FIG. 6(1), is formed over an SOI substrate. Thereafter, Poly-Si or amorphous Si B shown in FIG. 6(2) is formed and grooves or trenches each having a width of from 100 nm to 500 nm are defined in their corresponding positions of side walls to be formed later by the known photolithography and etching. Afterwards, the selective growth of silicon is performed to thereby deposit selectively grown Si C shown in FIG. 6(3) over the Poly-Si or amorphos Si B, whereby the width of each trench is adjusted to a range from 5 nm to 100 nm. Next, as shown in FIG. 6(4), the Poly-Si or amorphous Si B and the selectively grown Si C are removed by wet or dry etching after the removal of $SiO_2$ A lying at the bottoms of the trenches. In doing so, the SOI substrate itself is etched simultaneously. When SiO2 A is thereafter removed, extra fine trenches each having a width of from 5 nm to 100 nm, which cannot be formed by the conventional method, are defined in the SOI substrate as shown in FIG. 6(5). Then, gate oxidation is carried out to form a gate oxide film D shown in FIG. 6(6). Further, a Poly-Si gate E is formed as shown in FIG. 6(7) and side walls F are formed.

When the side wall structure formed by the above-described method is used to form silicides G as shown in FIG. 6(7), the silicides G are blocked by rectangular oxide films convex in the substrate direction, which are located below the side walls. Thus, the silicides do not seat under the side walls F and the resultant device can achieve not only an improvement in gate withstand voltage but also a reduction in gate leakage current. Further, the device also has a feature that since the degree of convexity of the oxide film below each side wall toward the substrate can be controlled by etching, the degree of downward convexity of the oxide film can be controlled according to the thickness of a silicide layer.

In the structure of the present invention as shown in FIG. 6(7), the degree of convexity of the oxide film below each side wall downward of the SOI substrate can be controlled according to the thickness of the silicides upon formation of the silicides different in thickness from each other. The silicides do not get under the side walls upon formation the silicide films different in thickness from each other. Further, silicide edges can be steeply controlled in the vertical direction along the sides of the side walls. The resultant device can achieve not only an increase in gate withstand voltage but also a decrease in gate leakage current.

Sixth Embodiment

FIGS. 7(1) through 7(5) are respectively process cross-sectional views for describing a sixth embodiment of the present invention. Since the process steps from FIGS. 6(1) to 6(4) employed in the fifth embodiment are similar process steps in the present embodiment, their description will be omitted.

After the execution of the process steps shown in FIGS. 6(1) through 6(4), trenches each having a width of about 50 nm and a depth of from about 5 nm to about 50 nm are first defined in an SOI substrate as shown in FIG. 7(1). Afterwards, Si is epitaxially grown to deposit epitaxial Si A' shown in FIG. 7(2) over the SOI substrate. Further, each of the trenches is adjusted to the required width and depth. The depth of each trench is set so as to range from 5 nm to 25 nm, for example, and the width thereof is set to range from 5 nm to the length of the width of a lower portion of each side wall D' to be formed later. Next, gate oxidation is performed to form a gate oxide film B' as shown in FIG. 7(3).

Further, when a Poly-Si gate C' is formed and the side walls D' are formed as shown in FIG. 7(4), an oxide film structure convex downwardly toward the SOI substrate is formed below each side wall D'.

According to the above-described method as compared with the fifth embodiment referred to above, it is easy to control the size (width and depth) of each trench shown in FIG. 7(1). Further, the side wall structure convex toward the substrate can be easily formed.

In the structure of the present invention such as shown in FIG. 7(5), the degree of downward convexity of the oxide film below each side wall toward the substrate can be easily controlled according to the thickness of the silicides upon formation of the silicides different in thickness from each other. The silicides do not get under the side walls upon formation the silicide films different in thickness from each other. Further, silicide edges can be steeply controlled in the vertical direction along the sides of the side walls. The resultant device can achieve an increase in gate withstand voltage, and a decrease in gate leakage current and limit a short channel effect.

Seventh Embodiment

Figure 8A:
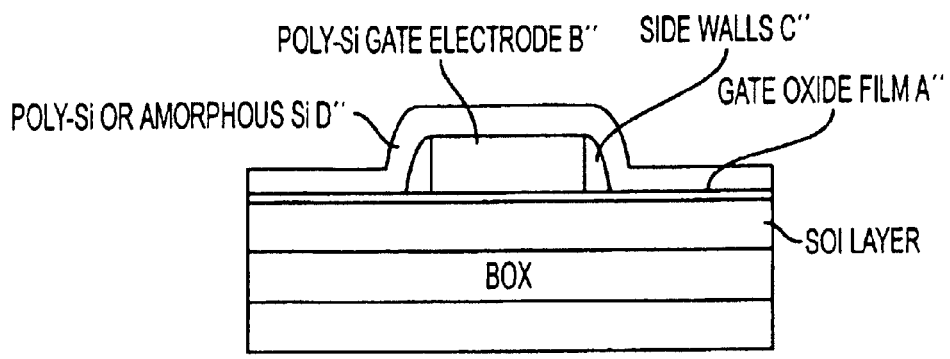
FIG. 8 is a process cross-sectional view for describing a seventh embodiment of the present invention.
Figure 8B:
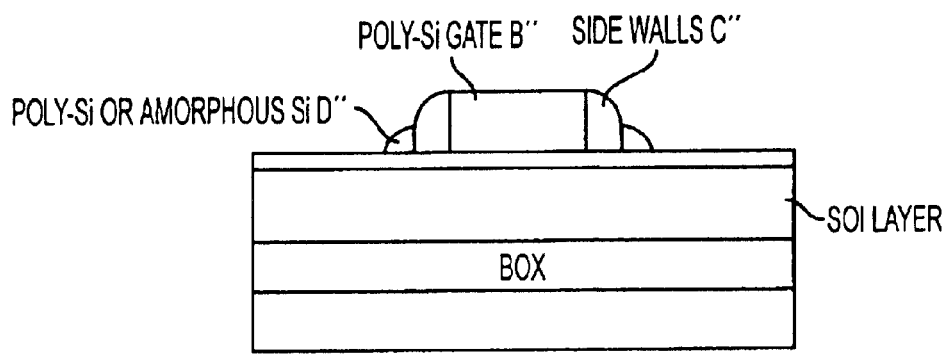
Figure 8C:
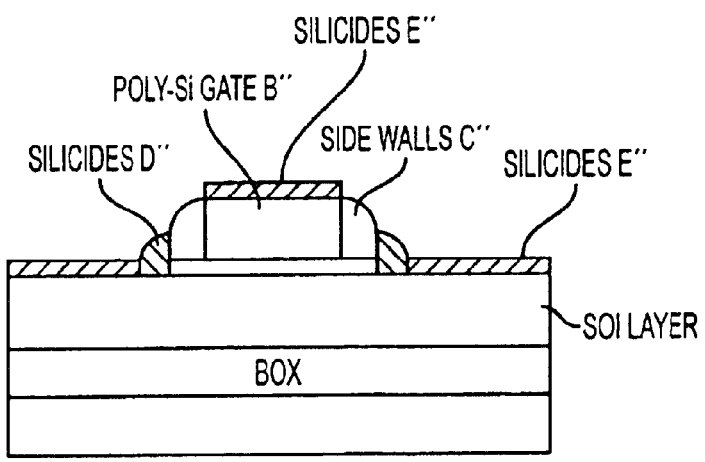

FIG. 8 is a process cross-sectional view showing a seventh embodiment. As shown in FIG. 8(1), a gate oxide film A", a Poly-Si gate electrode B", and side walls C" are formed in a normal process as shown in FIG. 8(1). Afterwards, Poly-Si or amorphous Si D" is formed. Next, anisotropic dry etching of Si is performed as shown in FIG. 8(2) to thereby form a structure in which Si D" equivalent to less than or equal to one-half the height of each side wall C" is left behind.

When silicides E" are formed through the use of the side wall structure formed by the above-described method, silicides as designated at a" are formed even outside the side walls as shown in FIG. 8(3). However, no silicides are formed below the gate oxide film A". This is why since the Poly-Si or amorphous Si D" rather than Si of an SOI substrate is easy to silicide, the lower sides of the side walls C" are not silicided.

In such a construction of the present invention as shown in the final structure shown in FIG. 8(3), the transverse and inner growth of silicides downward of the gate oxide film A" does not occur. Further, the resultant device can be improved in gate withstand voltage and reduced in gate leakage current and can limit a short channel effect.

It is needless to say that the device structures and manufacturing methods described in the first through seventh embodiments can be applied to a normal Si substrate similarly to the SOI substrate.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing a semiconductor electronic device, comprising the following steps:

a step for forming a gate electrode of a field effect transistor over a substrate;

a step for forming first side walls over sides of said gate electrode on a self-alignment basis respectively;

a step for performing over etching and etching edges of said first side walls by using trenching effects at the edges of said first side walls until said substrate is exposed;

a step for subjecting the exposed substrate to thermal oxidation to thereby form an oxide film substantially identical in quality to a gate oxide film; and a step for forming second side walls over side walls of said first side walls; and wherein said respective steps are successively executed.

2. A method of manufacturing a semiconductor electronic device, comprising the following steps:

a step for forming a gate electrode of a field effect transistor over a substrate;

a step for forming first side walls over sides of said gate electrode on a self-alignment basis respectively;

a step for performing over etching and etching edges of said first side walls by using trenching effects at the edges of said first side walls until said substrate is exposed;

a step for further etching said exposed substrate;

a step for forming an oxide film on said exposed substrate substantially identical in quality to a gate oxide film by thermal oxidation; and a step for forming second side walls over side walls of said first side walls;

and wherein said respective steps are successively executed.

3. A method of manufacturing a semiconductor electronic device, comprising the following steps:

a step for forming an $SiO_2$ film over a substrate;

a step for forming Poly-Si or amorphous Si over said $SiO_2$ film;

a step for patterning said Poly-Si or amorphous Si by known photolithography and etching;

a step for selectively growing an Si film over the surface of said Poly-Si or amorphous Si;

a step for performing etching with the selectively grown Si film as a mask to thereby remove said $SiO_2$ film;

a step for further performing etching to thereby define trenches in said substrate;

a step for removing the selectively grown Si film and said Poly-Si or amorphous Si;

a step for forming a gate electrode of MOSFET within a region interposed between the trenches defined in said substrate; and a step for forming side walls over sides of said gate electrode and burying the trenches defined in said substrate by lower portions of said formed side walls.

4. A method of manufacturing a semiconductor electronic device, comprising the following steps:

a step for defining trenches in a substrate by known photolithography and etching;

a step for forming an Si film over said substrate by selective epitaxial growth of Si to thereby adjust the depth and width of said each trench;

a step for forming a gate electrode of MOSFET within a region interposed between the trenches defined in said substrate; and a step for forming side walls over sides of said gate electrode and burying the trenches defined in said substrate by lower portions of said formed side walls.

5. A method of manufacturing a semiconductor electronic device, comprising the following steps:

a step for forming a gate electrode over a substrate;

a step for forming first side walls over sides of said gate electrode;

a step for depositing Poly-Si or amorphous Si over said substrate;

a step for performing anisotropic dry etching of Si to leave said Poly-Si or amorphous Si equivalent to less than or equal to one-half the height of said each first side wall over side walls of said first side walls, thereby forming second side walls;

a step for next forming a metal film and forming silicides by heat treatment.

6. The method as claimed in claim 5, wherein said substrate is an SOI substrate or an Si substrate.

7. The method as claimed in claim 2, wherein said substrate is an SOI substrate or an Si substrate.

8. The method as claimed in claim 3, wherein said substrate is an SOI substrate or an Si substrate.

9. The method as claimed in claim 4, wherein said substrate is an SOI substrate or an Si substrate.

10. The method as claimed in claim 5, wherein said substrate is an SOI substrate or an Si substrate.

11. The method of claim 1, wherein the exposed substrate at the edges of said first side walls is recessed and concave to the surface of the exposed substrate on which the gate electrode of the field effect transistor is formed.

12. The method of claim 11, wherein the recessed and concave exposed substrate is at least one of arcuate and rectangular in shape.

13. The method of claim 2, wherein the height of said second side walls is less than the height of said first side walls.

* * * * *